United States Patent
Kim et al.

(10) Patent No.: US 8,610,510 B2
(45) Date of Patent: Dec. 17, 2013

(54) LIMITER CIRCUIT AND VOLTAGE CONTROLLED OSCILLATOR INCLUDING THE SAME

(75) Inventors: Do-Hyung Kim, Seoul (KR); Ji-Hyun Kim, Hwasung-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 45 days.

(21) Appl. No.: 13/348,783

(22) Filed: Jan. 12, 2012

(65) Prior Publication Data

US 2012/0182076 A1    Jul. 19, 2012

(30) Foreign Application Priority Data

Jan. 14, 2011  (KR) .................. 10-2011-0004020

(51) Int. Cl.
*H03K 3/03*    (2006.01)
(52) U.S. Cl.
USPC ............. 331/57; 331/16; 331/34; 327/112; 327/180
(58) Field of Classification Search
USPC ................. 331/57, 16, 34; 327/112, 180
See application file for complete search history.

(56) References Cited

U.S. PATENT DOCUMENTS

| 6,621,313 | B2 | 9/2003 | Kurd et al. |
| 7,515,004 | B2 | 4/2009 | Shin et al. |
| 7,956,655 | B1 * | 6/2011 | Chiu .................... 327/108 |

FOREIGN PATENT DOCUMENTS

| JP | 2000-305528 | 11/2000 |
| KR | 1020070016456 | 2/2007 |

* cited by examiner

*Primary Examiner* — Arnold Kinkead
(74) *Attorney, Agent, or Firm* — F. Chau & Associates, LLC (57) ABSTRACT

A limiter circuit in a voltage controlled oscillator (VCO) includes a first control circuit, a second control circuit and a driving circuit having a pull-up transistor and a pull-down transistor. The first control circuit generates a first driving control signal for controlling the pull-up transistor based on an AC input signal and a first DC bias voltage. The second control circuit generates a second driving control signal for controlling the pull-down transistor based on the AC input signal and a second DC bias voltage. The driving circuit generates an output signal based on the first driving control signal and the second driving control signal. The output signal swings between a first voltage at the pull-up transistor and a second voltage at the pull-down transistor.

18 Claims, 9 Drawing Sheets

LIMITER CIRCUIT AND VOLTAGE CONTROLLED OSCILLATOR INCLUDING THE SAME

CROSS-REFERENCE TO RELATED APPLICATION

This application claims priority under 35 USC §119 to Korean Patent Application No. 2011-0004020, filed on Jan. 14, 2011 in the Korean Intellectual Property Office (KIPO), which is incorporated by reference herein in its entirety.

BACKGROUND

1. Technical Field

Exemplary embodiments relate to electronic circuits including a phase locked loop (PLL) that generates a clock signal, and more particularly to a voltage controlled oscillator (VCO) including a voltage-limiter circuit for implementing a PLL in electronic circuits.

2. Description of the Related Art

As a semiconductor device becomes smaller, integrated circuits included in the semiconductor device are typically operated with relatively low voltages for reducing power consumption. Furthermore, several different integrated circuits with different operating voltages may be employed in a single semiconductor device. A limiter circuit outputs a signal that has a voltage level kept within a predetermined voltage range. A semiconductor device may include the limiter circuit for preventing malfunctions of the integrated circuits with different operating voltages. For example, the limiter circuit may be employed in a phase locked loop (PLL) that generates a clock signal having a fixed phase and a fixed frequency. As the data input/output (I/O) speed required by the semiconductor device increases, a double data rate (DDR) method of data transmission has been used. In the DDR method, the data I/O speed is doubled in a way that data are respectively transferred at both a rising edge and a falling edge of one period of a clock signal, and thus the duty ratio of the clock signal is one of factors that impacts the performance of the semiconductor device.

SUMMARY

An aspect of the inventive concept provides a limiter circuit for use in a voltage controlled oscillator (VCO) of a phase locked loop (PLL) formed in an integrated circuit of a semiconductor device. The limiter includes a first control circuit, a second control circuit and a driving circuit having a pull-up transistor and a pull-down transistor. The first control circuit generates a first driving control signal for controlling the pull-up transistor based on an AC input signal and a first DC bias voltage. The second control circuit generates a second driving control signal for controlling the pull-down transistor based on the AC input signal and a second DC bias voltage. The driving circuit generates an output signal based on the first driving control signal and the second driving control signal. The output signal swings between a first voltage at the pull-up transistor and a second voltage at the pull-down transistor.

The first control circuit generates a first alternating current (AC) signal by removing (filtering out) the direct current (DC) component of the input signal, and generates the first driving control signal by adding the first AC signal to the first bias voltage.

The second control circuit generates a second AC signal by removing (filtering out) the DC component of the input signal, and generates the second driving control signal by adding the second AC signal to the second bias voltage.

The first control circuit includes a first capacitor (operating as a first DC filter) and a first resistor. The first electrode of the first capacitor receives the input signal and its second electrode is connected to a first node. The first driving control signal is output at the first node. The first end of the first resistor receives the first bias voltage and its second end is connected to the first node.

The second control circuit includes a second capacitor (operating as a second DC filter) and a second resistor. The first electrode of the second capacitor receives the input signal and its second electrode is connected to a second node. The second driving control signal is output at the second node. The first end of the second resistor receives the second bias voltage and its second end is connected to the second node.

The driving circuit includes a pull-up transistor and a pull-down transistor connected in series between the first voltage and the second voltage. The control gate of the pull-up transistor receives the first driving control signal, and the control gate of the pull-down transistor receives the second driving control signal.

The level of the first voltage may be higher than the threshold voltage level of the pull-up transistor and higher than the threshold voltage level of the pull-down transistor.

Both of the level of the first bias voltage and the level of the second bias voltage may be lower than the level of the first voltage.

Some exemplary embodiments provide a limiter circuit capable of operating with relatively low power supply voltages and having relatively robust and consistent performance despite process, voltage, and temperature (PVT) variations.

Some exemplary embodiments provide a voltage controlled oscillator (VCO) including the limiter circuit and capable of effectively controlling the duty ratio of an output signal.

According to other exemplary embodiments, a voltage controlled oscillator (VCO) includes an oscillation signal generation circuit and a limiter circuit. The oscillation signal generation circuit generates a first oscillation signal and a second oscillation signal based on an oscillation control signal. The first and second oscillation signals are a pair of differential signals. The limiter circuit generates a first swing signal and a second swing signal based on the first oscillation signal, the second oscillation signal, a first bias voltage and a second bias voltage. The first and second swing signals swing between a first voltage (e.g., VCC) and a second voltage (e.g., VSS).

The VCO may further include an interpolation circuit. The interpolation circuit generates a first output signal and a second output signal by compensating the duty ratio of the first swing signal and the duty ratio of the second swing signal. The first and second output signals are a pair of differential signals.

Both of the duty ratio of the first output signal and the duty ratio of the second output signal are about 50:50.

The oscillation signal generation circuit may include an oscillation control circuit and an oscillation circuit. The oscillation control circuit generates a control current based on the oscillation control signal. The oscillation circuit generates the first oscillation signal and the second oscillation signal based on the control current. The frequency of the first oscillation signal and the frequency of the second oscillation signal correspond to the oscillation control signal.

A third voltage may be induced based on the control current. The first and second oscillation signals may swing between the third voltage and the second voltage. The level of the third voltage may be lower than the level of the first voltage and may be higher than the level of the second voltage.

The limiter circuit may include a first limiter circuit and a second limiter circuit. The first limiter circuit generate a first driving control signal and a second driving control signal based on the first oscillation signal, the first bias voltage and the second bias voltage, and generates the first swing signal based on the first driving control signal and the second driving control signal. The second limiter circuit generates a third driving control signal and a fourth driving control signal based on the second oscillation signal, the first bias voltage and the second bias voltage, and generate the second swing signal based on the third driving control signal and the fourth driving control signal.

The interpolation circuit generates the first output signal and the second output signal by performing a phase interpolation operation on the first swing signal and the second swing signal.

The interpolation circuit includes a first inverter, a second inverter, a latch, a third inverter and a fourth inverter. The first inverter receives the first swing signal. The second inverter receives the second swing signal. The latch is connected between the output terminal of the first inverter and the output terminal of the second inverter, and performs the phase interpolation operation by merging the output signal of the first inverter and the output signal of the second inverter. The input terminal of the third inverter is connected to the output terminal of the first inverter and its output terminal outputs the first output signal. The input terminal of the fourth inverter is connected to the output terminal of the second inverter and its output terminal outputs the second output signal.

As above noted, a limiter circuit according to some exemplary embodiments includes two capacitors for removing the DC component of an input signal. Thus the pull-up transistor and the pull-down transistor included in the limiter circuit can be driven by different bias voltages and different driving control signals. Thus, the limiter circuit can operate with relatively low power supply voltage, and can have relatively low power consumption and relatively robust performance against PVT variations. A VCO according to some exemplary embodiments includes the limiter circuit and an interpolation circuit performing a phase interpolation operation. Thus, the VCO may have relatively low power consumption and improved performance, and can effectively generate its output clock signal having the duty ratio of about 50:50.

Various exemplary embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise.

BRIEF DESCRIPTION OF THE DRAWINGS

Illustrative, non-limiting exemplary embodiments will be more clearly understood from the following detailed description taken in conjunction with the accompanying drawings in which.

DETAILED DESCRIPTION OF THE EXEMPLARY EMBODIMENTS

Figure 1:
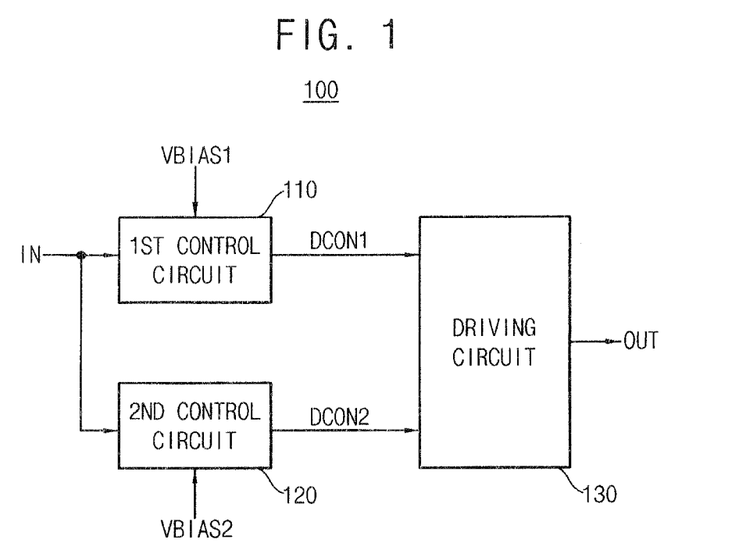
FIG. 1 is a block diagram of a limiter circuit 100 according to an exemplary embodiment.

FIG. 1 is a block diagram of a limiter circuit according to an exemplary embodiment of the inventive concept.

Referring to FIG. 1, a limiter circuit 100 includes a first control circuit 110, a second control circuit 120 and a driving circuit 130.

The first control circuit 110 generates a first driving control signal DCON1 based on an input signal IN and a first bias voltage VBIAS1. For example, the first control circuit 110 generates the first driving control signal DCON1 by removing (i.e., filtering out) the direct current (DC) component of the input signal IN and by adding the DC component-removed input signal IN to the first bias voltage VBIAS1. The input signal IN and the first driving control signal DCON1 may be voltage signals.

The second control circuit 120 generates a second driving control signal DCON2 based on the input signal IN and a second bias voltage VBIAS2. For example, the second control circuit 120 generates the second driving control signal DCON2 by removing the DC component of the input signal IN and by adding the DC component-removed input signal IN to the second bias voltage VBIAS2. The second driving control signal DCON2 may be a voltage signal.

The driving circuit 130 generates an output signal OUT based on the first driving control signal DCON1 and the second driving control signal DCON2. The output signal OUT swings between a first voltage (VDD) and a second voltage (VSS). For example, the output signal OUT may be a voltage signal, and the voltage level of the output signal OUT may correspond to one of the level of the first voltage (VCC) and the level of the second voltage (VSS) based on the first driving control signal DCON1 and the second driving control signal DCON2.

In an exemplary embodiment, the level of the first voltage (VCC) is higher than the level of the second voltage (VSS). For example, the first voltage may be a power supply voltage (VCC) and the second voltage VSS may be a ground voltage. In this case, when the voltage level of the input signal IN is higher than the level of a reference voltage, the voltage level of the output signal OUT corresponds to the level of the first voltage (VCC). When the voltage level of the input signal IN is lower than the level of the reference voltage, the voltage level of the output signal. OUT corresponds to the level of the second voltage (VSS). The reference voltage may have a level being intermediate between the level of the first voltage (VCC) and the level of the second voltage (VSS). For example, the reference voltage may have the level (VDD–VSS)/2 being intermediate between the level of the first voltage (VDD) and the level of the second voltage (VSS).

Figure 2:
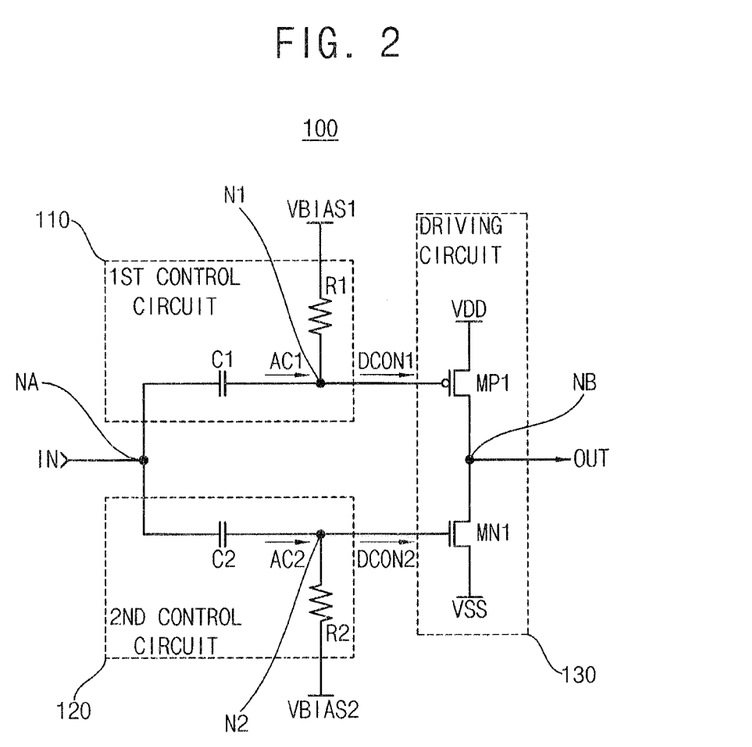
FIG. 2 is a circuit diagram of an exemplary implementation of the limiter circuit 100 of FIG. 1.

FIG. 2 is a circuit diagram of an exemplary implementation of the limiter circuit 100 of FIG. 1.

Referring to FIG. 2, the limiter circuit 100 includes the first control circuit 110, the second control circuit 120 and the driving circuit 130.

The first control circuit 110 generates a first alternating current (AC) signal AC1 by removing the DC component of the input signal IN, and generates the first driving control signal DCON1 by adding the first AC signal AC1 to the first bias voltage VBIAS1. The first control circuit 110 included a first capacitor C1 and a first resistor R1.

The first capacitor C1 has a first electrode and a second electrode. The first electrode of the first capacitor C1 is connected to an input node NA, and receives the input signal IN through the input node NA. The second electrode of the first capacitor C1 is connected to a first node N1. The first driving control signal DCON1 is output at the first node N1. The DC component of the input signal IN is removed by the first capacitor C1, and the first AC signal AC1 is thusly generated.

The first resistor R1 has a first end and a second end. The first end of the first resistor R1 receives the first bias voltage VBIAS1. The second end of the first resistor R1 is connected to the first node N1. The first bias voltage VBIAS1 is provided to the first node N1 through the first resistor R1.

At the first node N1, the first AC signal AC1 and the first bias voltage VBIAS1 are added, and the first driving control signal DCON1 is generated. Since the first AC signal AC1 only includes the AC components of the input signal IN and since the first bias voltage VBIAS1 is a DC voltage, the first AC signal AC1 and the first bias voltage VBIAS1 included in the first driving control signal DCON1 may be separated. Thus, the input signal IN and the first bias voltage VBIAS1 may be separated by removing the DC component of the input signal IN.

The second control circuit 120 generates a second AC signal AC2 by removing the DC component of the input signal IN, and generates the second driving control signal DCON2 by adding the second AC signal AC2 to the second bias voltage VBIAS2. The second control circuit 120 include a second capacitor C2 and a second resistor R2.

The second capacitor C2 has a first electrode and a second electrode. The first electrode of the second capacitor C2 is connected to the input node NA, and receives the input signal IN through the input node NA. The second electrode of the second capacitor C2 is connected to a second node N2. The second driving control signal DCON2 is output through the second node N2. The DC component of the input signal IN is removed by the second capacitor C2, and the second AC signal AC2 is thusly generated. The second AC signal AC2 may be substantially the same as or may be different from the first AC signal AC1 depending on capacitances of the first and second capacitors C1 and C2.

The second resistor R2 has a first end and a second end. The first end of the second resistor R2 receives the second bias voltage VBIAS2. The second end of the second resistor R2 is connected to the second node N2. The second bias voltage VBIAS2 is provided to the second node N2 through the second resistor R2.

At the second node N2, the second AC signal AC2 and the second bias voltage VBIAS2 are added, and the second driving control signal DCON2 is generated. Since the second AC signal AC2 includes only the AC components of the input signal IN and the second bias voltage VBIAS2 is a DC voltage, the second AC signal AC2 and the second bias voltage VBIAS2 included in the second driving control signal DCON2 may be separated. Thus, the input signal. IN and the second bias voltage VBIAS2 may be separated by removing the DC component of the input signal IN.

The driving circuit 130 generates the output signal OUT based on the first driving control signal DCON1 and the second driving control signal DCON2. The driving circuit 130 includes a pull-up transistor (p-type FET MP1) and a pull-down transistor (n-type FET MN2) connected in series between the first voltage (VDD) and the second voltage (VSS).

The pull-up transistor MP1 may be a p-type metal oxide semiconductor (PMOS) transistor. The pull-up transistor MP1 has a first electrode (e.g., its source) connected to the first voltage VDD, a second electrode (e.g., its drain) connected to an output node NB and a control gate receiving the first driving control signal DCON1. When the voltage level of the input signal IN is higher than the level of the reference voltage, (i.e., when the pull-up transistor MP1 is turned ON in response to the first driving control signal DCON1), the driving circuit 130 generates the output signal OUT having the level of the first voltage VDD.

The pull-down transistor MN1 may be a n-type metal oxide semiconductor (NMOS) transistor. The pull-down transistor MN1 has a first electrode (e.g., its drain) connected to the output node NB, a second electrode (e.g., its source) connected to the second voltage VSS and a control gate receiving the second driving control signal DCON2. When the voltage level of the input signal IN is lower than the level of the reference voltage, (i.e., when the pull-down transistor MN1 is turned ON in response to the second driving control signal DCON2), the driving circuit 130 generate the output signal OUT having the level of the second voltage VSS.

As described above, the first driving control signal DCON1 includes the first bias voltage VBIAS1 and the first AC signal AC1 corresponding to the AC components of the input signal IN. The second driving control signal DCON2 includes the second bias voltage VBIAS2 and the second AC signal AC2 corresponding to the AC components of the input signal IN. Thus, the pull-up transistor MP1 and the pull-down transistor MN1 may be driven by different bias voltages. For example, the pull-up transistor MP1 may be driven in response to the first driving control signal DCON1 including the first bias voltage VBIAS1, and the pull-down transistor MN1 may be driven in response to the second driving control signal DCON2 including the second bias voltage VBIAS2.

In an exemplary embodiment, each of the first and second bias voltages VBIAS1 and VBIAS2 has a voltage level in the range between the level of the second voltage VSS and the level of the first voltage VDD. For example, the level of the first bias voltage VBIAS1 may be higher than the threshold voltage level of the pull-up transistor MP1 and may be lower than the level of the first voltage VDD. The level of the second bias voltage VBIAS2 may be higher than the threshold voltage level of the pull-down transistor MN1 and may be lower than the level of the first voltage VDD. Both of the level of the first bias voltage VBIAS1 and the level of the second bias voltage VBIAS2 may be lower than the level of the first voltage. If the levels of bias voltages VBIAS1 and VBIAS2 are lower than the threshold voltage levels of the transistors MP1 and MN1, the transistors MP1 and MN1 may operate abnormally.

In an exemplary embodiment, the level of the first voltage VDD is higher than both the threshold voltage level of the pull-up transistor MP1 and the threshold voltage level of the pull-down transistor MN1. If the threshold voltage level of the pull-up transistor MP1 is higher than the threshold voltage level of the pull-down transistor MN1, the minimum level of the first voltage VDD may be substantially the same as the threshold voltage level of the pull-up transistor MP1.

A conventional limiter circuit includes a single capacitor for removing the DC component of an input signal. In the conventional limiter circuit, a pull-up transistor and a pull-down transistor in a driving circuit are driven in response to a single driving control signal generated by a first biasing scheme or a second biasing scheme. In the first biasing scheme, the single driving control signal is generated based on the DC component-removed input signal and a single bias voltage. In the second biasing scheme, a single self-biased voltage is generated based on an output signal, and the driving control signal is generated based on the DC component-removed input signal and the self-biased voltage.

However, if the level of the power supply voltage is lower than the sum of the threshold voltage level of the pull-up transistor and the threshold voltage level of the pull-down transistor, then the pull-up transistor and the pull-down transistor in the conventional limiter circuit operate abnormally. In the conventional limiter circuit driven by the second biasing scheme, as the power supply voltage increases, a current flowing through the limiter circuit increases, and thus the conventional limiter circuit has relatively high power consumption. In addition, the conventional limiter circuit may be vulnerable to process, voltage, and temperature (PVT) variations.

The limiter circuit 100 according to the present exemplary embodiment includes two capacitors C1 and C2, both for removing the DC component of the input signal IN. In the limiter circuit 100, each of the pull-up transistor MP1 and the pull-down transistor MN1 are driven in response to a respective one of the first driving control signal DCON1 and the second driving control signal DCON2. The first driving control signal DCON1 is generated based on the first bias voltage VBIAS1 and the second driving control signal DCON2 is generated based on the second bias voltage VBIAS2. The pull-up transistor MP1 and the pull-down transistor MN1 can operate normally even if relatively low power supply voltage is applied to these transistors, because the pull-up transistor MP1 and the pull-down transistor MN1 are driven by different bias voltages VBIAS1 and VBIAS2. Thus, the limiter circuit 100 can operate even with a relatively low power supply voltage, and may have relatively low power consumption and relatively robust performance against PVT variations, thereby effectively generating the output signal OUT that swings between the first voltage VDD and the second voltage VSS.

Figure 3:
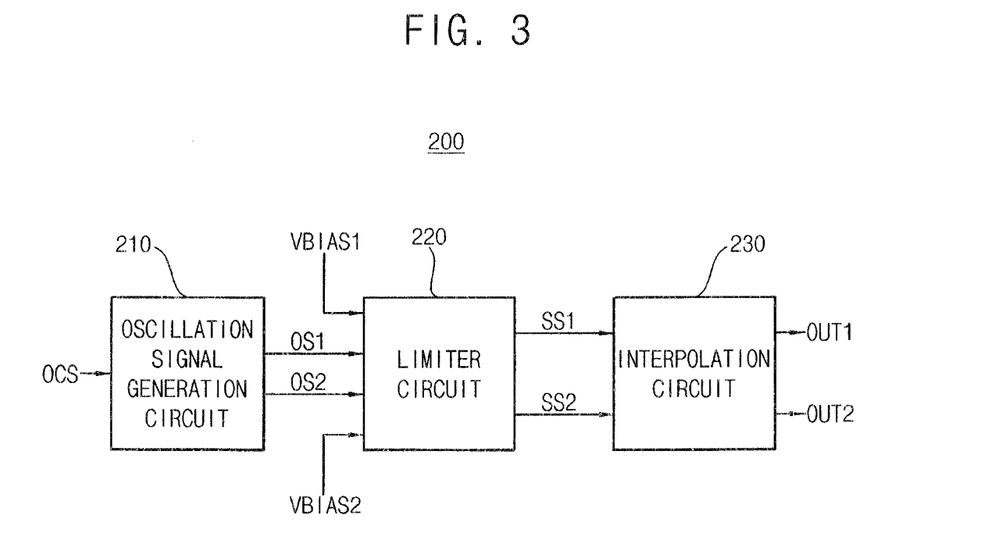
FIG. 3 is a block diagram of a voltage controlled oscillator (VCO) 200 according to some exemplary embodiments.

FIG. 3 is a block diagram of a voltage controlled oscillator (VCO) 200 according to some exemplary embodiments.

Referring to FIG. 3, the VCO 200 includes an oscillation signal generation circuit 210, a limiter circuit 220 and an interpolation circuit 230.

The oscillation signal generation circuit 210 generates a first oscillation signal OS1 and a second oscillation signal OS2 based on a received oscillation control signal OCS. The first and second oscillation signals OS1 and OS2 are a pair of differential signals. For example, the first oscillation signal OS1 may be an inversion signal of the second oscillation signal OS2, and the second oscillation signal OS2 may be an inversion signal of the first oscillation signal OS1. The oscillation control signal OCS, the first oscillation signal OS1 and the second oscillation signal OS2 may be voltage signals. Each of the first and second oscillation signals OS1 and OS2 may have a frequency that corresponds to the oscillation control signal OCS. For example, when the voltage level of the oscillation control signal OCS increases, the frequency of the first oscillation signal OS1 and the frequency of the second oscillation signal OS2 increases.

The limiter circuit 220 generates a first swing signal SS1 and a second swing signal SS2 based on the first oscillation signal OS1, the second oscillation signal OS2, a first bias voltage VBIAS1 and a second bias voltage VBIAS2. Each of the first and second swing signals SS1 and SS2 swing between a first voltage and a second voltage. The limiter circuit 220 may include at least one (e.g., two) instances of the limiter circuit 100 of FIG. 1. The first limiter circuit 100 in the limiter circuit 220 generates the first swing signal SS1 having a duty ratio based on the first oscillation signal OS1, a first bias voltage VBIAS1 and a second bias voltage VBIAS2. The second limiter circuit 100 in the limiter circuit 220 generates the second swing signal SS2 having a duty ratio based on the second oscillation signal OS2, the first bias voltage VBIAS1 and the second bias voltage VBIAS2.

In an exemplary embodiment, the first and second oscillation signals OS1 and OS2 limitedly swing between a third voltage and the second voltage. The third voltage may have a level being lower than the level of the first voltage (e.g., the power supply voltage VDD) and higher than the level of the second voltage (e.g., the ground voltage VSS). The first and second swing signals SS1 and SS2 correspond to the first and second oscillation signals OS1 and OS2, respectively, and may fully swing between the first voltage and the second voltage.

The interpolation circuit 230 generates a first output signal OUT1 and a second output signal OUT2 by compensating the duty ratio of the first swing signal SS1 and the duty ratio of the second swing signal SS2. The first and second output signals OUT1 and OUT2 are a pair of differential signals. For example, the interpolation circuit 230 may generate the first output signal OUT1 and the second output signal OUT2 by performing a phase interpolation operation on the first swing signal SS1 and the second swing signal SS2. The duty ratio of the first output signal OUT1 and the duty ratio of the second output signal OUT2 may both be about 50:50.

The VCO 200 according to the present exemplary embodiment includes the limiter circuit 220 having the at least one of limiter circuits 100 of FIG. 1 and the interpolation circuit 230. Thus, the VCO 200 can have relatively low power consumption and improved performance, and may effectively generate the output signals OUT1 and OUT2 each of which has a duty ratio of about 50:50. In addition, the VCO 200 has compatibility with various types of conventional phase locked loop (PLL). For example, the VCO 200 may be employed in the conventional PLL without including additional circuits.

Figure 4:
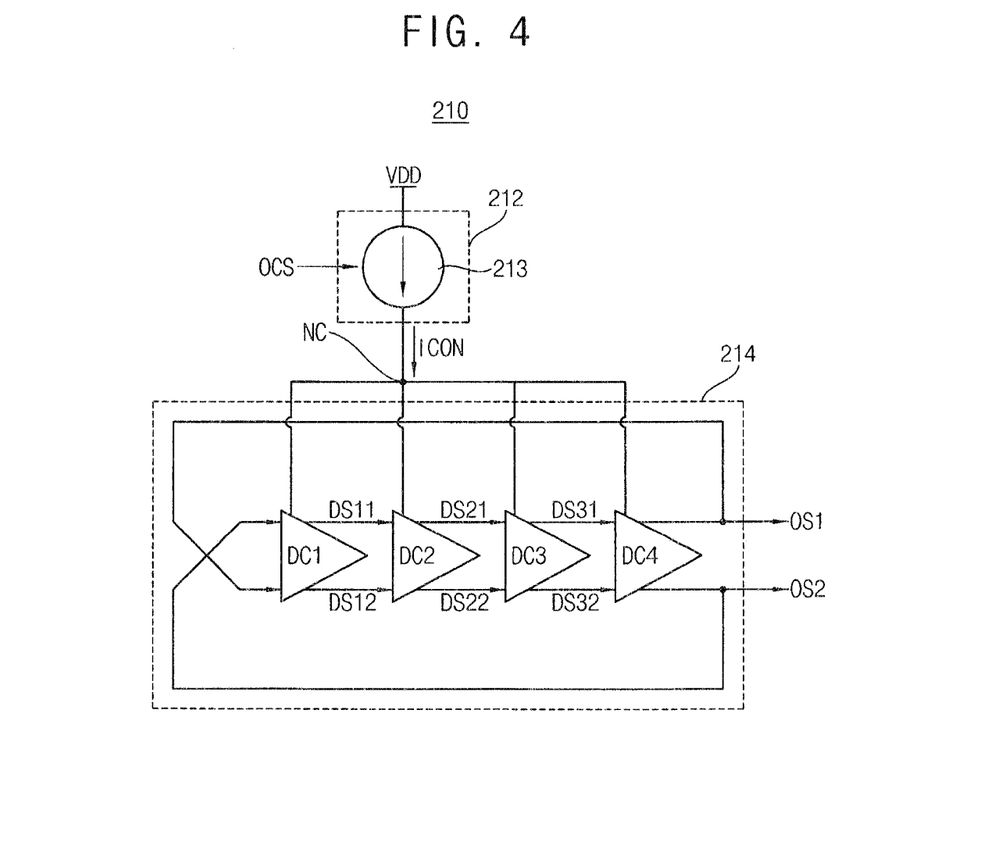
FIG. 4 is a block diagram of an exemplary implementation of the oscillation signal generation circuit 210 included in the VCO of FIG. 3.

FIG. 4 is a block diagram of an exemplary implementation of the oscillation signal generation circuit 210 included in the VCO of FIG. 3.

Referring to FIG. 4, the oscillation signal generation circuit 210 includes an oscillation control circuit 212 and an oscillation circuit 214.

The oscillation control circuit 212 generates a control current ICON based on the oscillation control signal OCS. The oscillation control circuit 212 includes a current source 213 having at least one transistor. In an exemplary embodiment, the current source 213 may be implemented with a current mirror. In another exemplary embodiment, the current source 213 may be implemented with a temperature-independent current source that generates the control current having a stable level independent of temperature variation.

The oscillation circuit 214 generates the first oscillation signal OS1 and the second oscillation signal OS2 based on the control current ICON. For example, the third voltage may be induced at a control node NC based on the control current ICON. As described above, the level of the third voltage may be lower than the level of the first voltage (VCC) and may be higher than the level of the second voltage (VSS), and thus the first and second oscillation signals OS1 and OS2 may limitedly swing between the third voltage and the second voltage. Each of the first oscillation signal OS1 and the second oscillation signal OS2 may have a sinusoidal waveform.

The oscillation circuit 214 includes a plurality of differential delay cells that are cascaded-connected. For example, the oscillation circuit 214 includes four differential delay cells DC1, DC2, DC3 and DC4, as illustrated in FIG. 4. The first differential delay cell DC1 generates a pair of first differential signals DS11 and DS12 based on the control current ICON, the first oscillation signal OS1 and the second oscillation signal OS2. The second differential delay cell DC2 generates a pair of second differential signals DS21 and DS22 based on the control current ICON and the pair of first differential signals DS11 and DS12. The third differential delay cell DC3 generates a pair of third differential signals DS31 and DS32 based on the control current ICON and the pair of second differential signals DS21 and DS22. The fourth differential delay cell DC4 generates the first oscillation signal OS1 and the second oscillation signal OS2 based on the control current ICON and the pair of third differential signals DS31 and DS32.

Figure 5:
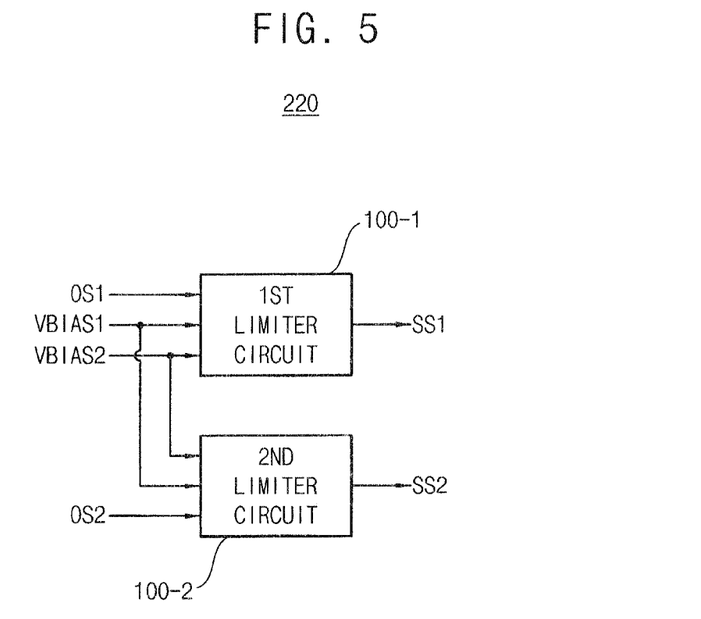
FIG. 5 is a block diagram of an exemplary implementation of the limiter circuit 220 included in the VCO of FIG. 3.

FIG. 5 is a block diagram of an exemplary implementation of the limiter circuit 220 included in the VCO of FIG. 3.

Referring to FIG. 5, the limiter circuit 220 includes a first limiter circuit 100-1 (first instance of limiter 100 of FIG. 1) and a second limiter circuit 100-2 (second instance of limiter 100 of FIG. 1).

The first limiter circuit 100-1 internally generates a first driving control signal (DCON1 in FIG. 1) and a second driving control signal (DCON2 in FIG. 1) based on the first oscillation signal OS1, the first bias voltage VBIAS1 and the second bias voltage VBIAS2, and outputs the first swing signal SS1 based on the first driving control signal and the second driving control signal. The second limiter circuit 100-2 internally generates a third driving control signal (DCON1 in FIG. 1) and a fourth driving control signal (DCON2 in FIG. 1) based on the second oscillation signal OS2, the first bias voltage VBIAS1 and the second bias voltage VBIAS2, and outputs the second swing signal SS2 based on the third driving control signal and the fourth driving control signal.

In an exemplary embodiment, the first limiter circuit 100-1 and the second limiter circuit 100-2 may be the same as limiter circuit 100 of FIG. 1. For example, each of the first and second limiter circuits 100-1 and 100-2 may include a first control circuit 110 having a first capacitor and a first resistor, a second control circuit 120 having a second capacitor and a second resistor, and a driving circuit 130 having a pull-up transistor and a pull-down transistor. The pull-up transistor and the pull-down transistor of the driving circuit 130 are driven by different driving control signals (i.e., different bias voltages).

In an present exemplary embodiment of FIG. 5, each of the first swing signal SS1 and the second swing signal SS2 may have a square waveform. For example, when the voltage level of the first oscillation signal OS1 is higher than the level of the reference voltage, the first swing signal SS1 has a voltage level corresponding to the first voltage (e.g., the power supply voltage VDD). When the voltage level of the first oscillation signal OS1 is lower than the level of the reference voltage, the first swing signal SS1 has a voltage level corresponding to the second voltage (e.g., the ground voltage VSS). When the voltage level of the second oscillation signal OS2 is higher than the level of the reference voltage, the second swing signal SS2 has a voltage level corresponding to the first voltage. When the voltage level of the second oscillation signal OS2 is lower than the level of the reference voltage, the second swing signal SS2 has a voltage level corresponding to the second voltage. As described above, the reference voltage may have the level (e.g., VDD/2) being intermediate between the level of the first voltage and the level of the second voltage.

Figure 6:
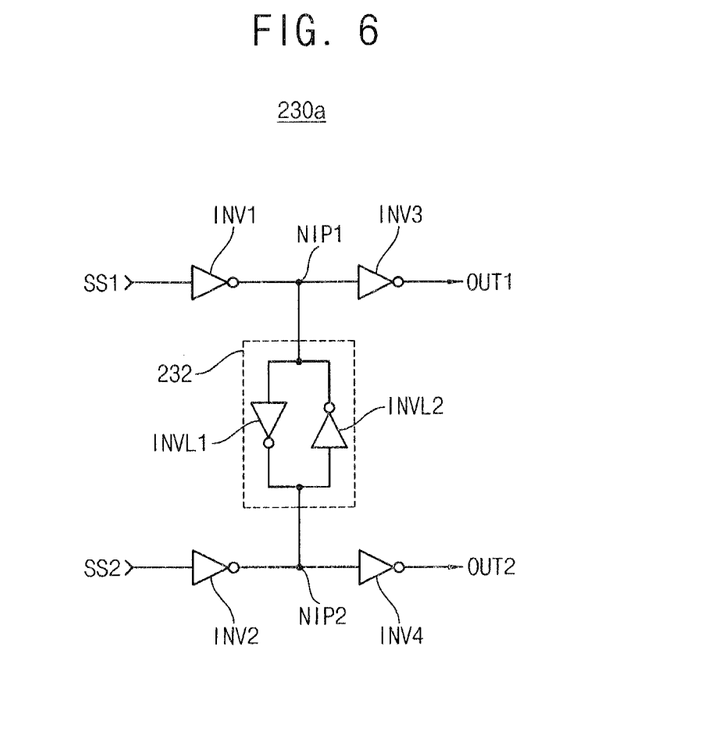
FIG. 6 is a block diagram of an exemplary implementation 230a of the interpolation circuit 230 in the VCO of FIG. 3.

FIG. 6 is a block diagram of an exemplary implementation 230a of the interpolation circuit 230 in the VCO of FIG. 3.

Referring to FIG. 6, the interpolation circuit 230a (230) includes a first inverter INV1, a second inverter INV2, a first latch 232, a third inverter INV3 and a fourth inverter INV4.

The input terminal of the first inverter INV1 receives the first swing signal SS1 and its output terminal is connected to a first internal node NIP1. The input terminal of the second inverter INV2 receives the second swing signal SS2 and its output terminal is connected to a second internal node NIP2. The first inverter INV1 invert the first swing signal SS1, and the second inverter INV2 inverts the second swing signal SS2.

The first latch 232 is connected between the output terminal of the first inverter INV1 (i.e., the first internal node NIP1) and the output terminal of the second inverter INV2 (i.e., the second internal node NIP2). The first latch 232 performs the phase interpolation operation by merging the output signal of the first inverter INV1 and the output signal of the second inverter INV2. Details of the phase interpolation operation will be described below with reference to FIG. 7.

The input terminal of the third inverter INV3 is connected to the output terminal of the first inverter INV1 (i.e., the first internal node NIP1). The input terminal of the fourth inverter INV4 is connected to the output terminal of the second inverter INV2 (i.e., the second internal node NIP2). The third inverter INV3 inverts the voltage at the first internal node NIP1 to provide the first output signal OUT1 at its output terminal. The fourth inverter INV4 inverts the voltage at the second internal node NIP2 to provide the second output signal OUT2 at its output terminal.

The first latch 232 includes a first internal inverter INVL1 and a second internal inverter where inputs and outputs of the inverters INVL1 and INVL2 are cross-coupled. The input terminal of the first internal inverter INVL1 is connected to the first internal node NIP1 and its output terminal is connected to the second internal node NIP2. The input terminal of the second internal inverter INVL2 is connected to the second internal node NIP2 and its output terminal is connected to the first internal node NIP1.

Since the first and second oscillation signals OS1 and OS2 limitedly swing between the third voltage and the second voltage, and since the limiter circuit 220 generates the first and second swing signals SS1 and SS2 based on the reference voltage having the intermediate level between the first voltage level and the second voltage level, the duty ratio of the first swing signal SS1 may not be about 50:50 and the duty ratio of the second swing signal SS2 may not be about 50:50. The interpolation circuit 230a performs the phase interpolation operation on the first and second swing signals SS1 and SS2 to generate the first and second output signals OUT1 and OUT2 each of which has a duty ratio of about 50:50.

Figure 7:
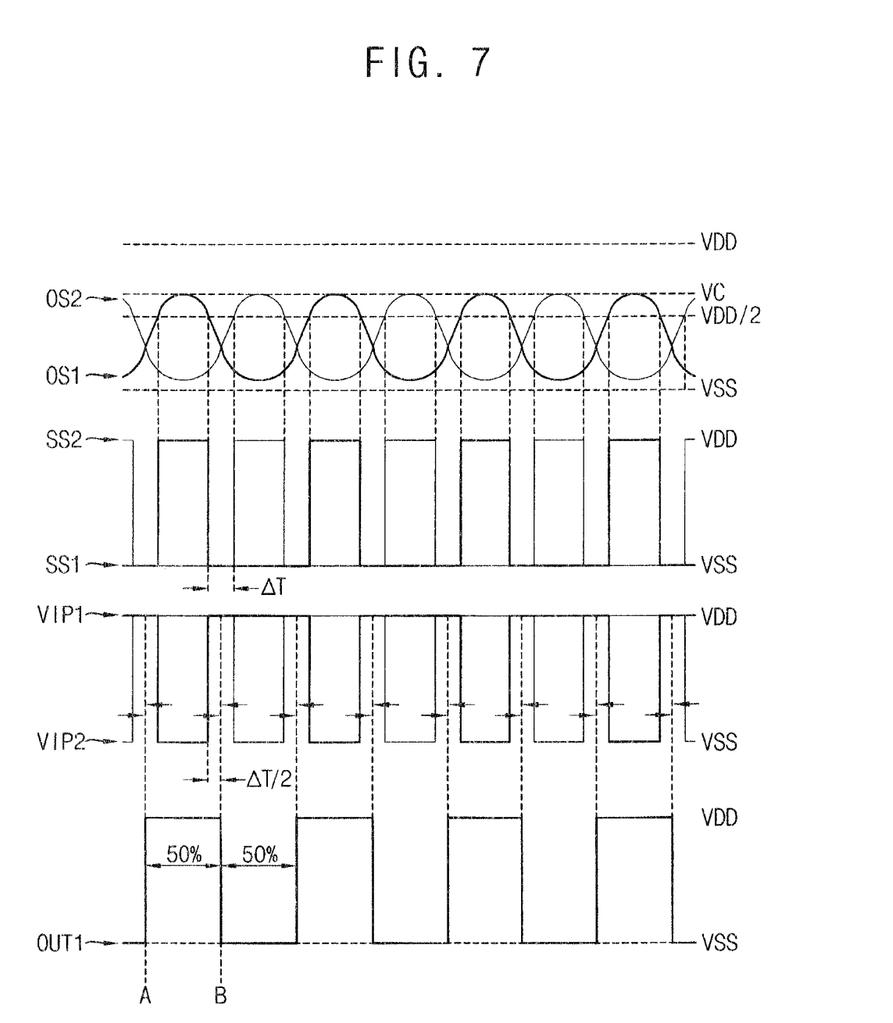
FIG. 7 is a timing diagram for describing an operation of the VCO 200 of FIG. 3.

FIG. 7 is a timing diagram for describing an operation of the VCO 200 of FIG. 3.

Hereinafter, an operation of the VCO 200 will be described with reference to FIGS. 3 through 7.

The oscillation signal generation circuit 210 generates the first and second oscillation signals OS1 and OS2 each of which has a frequency corresponding to the oscillation control signal OCS. Each of the first and second oscillation signals OS1 and OS2 has a sinusoidal waveform, and limitedly swings between the third voltage VC and the second voltage VSS.

The limiter circuit 220 generates the first and second swing signals SS1 and SS2 based on the first and second oscillation signals OS1 and OS2 and the first and second bias voltage VBIAS1 and VBIAS2. Each of the first and second swing signals SS1 and SS2 has a square waveform. When the first oscillation signal OS1 is higher than the reference voltage VDD/2, the first swing signal SS1 has the level of the first voltage VDD. When the first oscillation signal OS1 is lower than the reference voltage VDD/2, the first swing signal SS1 has the level of the second voltage VSS. The duty ratio of the first swing signal SS1 is not about 50:50. In the first swing signal SS1, a first time interval having a logic low level (i.e., VSS) is longer than a second time interval having a logic high level (i.e., VDD) by about Δt. The second swing signal SS2 is similar to the first swing signal SS1. However, the logic high time interval of the first swing signal SS1 and the logic high time interval of the second swing signal SS2 are not overlapped.

The first inverter INV1 included in the interpolation circuit 230a (FIG. 6) inverts the first swing signal SS1. In a first internal voltage VIP1 at the output terminal of the first inverter INV1 (e.g., the first internal node NIP1), a third time interval having the logic high level (i.e., VDD) is longer than a fourth time interval having a logic low level (i.e., VSS) by about Δt. The second inverter INV2 included in the interpolation circuit 230a inverts the second swing signal SS2. A second internal voltage VIP2 is similar to the first internal voltage VIP1. Thus, falling edge of the first internal voltage VIP1 overlaps the corresponding rising edge of the second internal voltage VIP2 by about Δt (e.g., around at time A). The rising edge of the first internal voltage VIP1 is overlapped by the corresponding falling edge of the second internal voltage VIP2 by about Δt (e.g., around at time B).

The first latch 232 included in interpolation circuit 230a performs the phase interpolation operation by averaging the overlapped time interval. The overlapped time interval indicates that both of the first and second internal voltage VIP1 and VIP2 have the logic high level (i.e., VDD). For example, around time A, the falling edge of the first internal voltage VIP1 leads by about Δt/2, and the rising edge of the second internal voltage VIP2 lags by about Δt/2. Around at time b, the rising edge of the first internal voltage VIP1 lags by about Δt/2, and the falling edge of the second internal voltage VIP2 leads by about Δt/2.

The third inverter IN V3 included in the interpolation circuit 230a inverts the phase-interpolated voltage at the first internal node NIP1 to generate the first output signal OUT1. The first output signal OUT1 transitions from the logic low level to the logic high level at time A, and transitions from the logic high level to the logic low level at time B. Thus, the first output signal OUT1 has a rising edge at time A, and has a falling edge at time B. The fourth inverter INV4 included in the interpolation circuit 230a inverts the phase-interpolated voltage at the second internal node NIP2 to generate the second output signal OUT2 complementary with the first output signal. Thus, the interpolation circuit 230a adjusts the duty ratio of the first and second swing signals SS1 and SS2 by performing such phase interpolation operation, and thus the VCO 200 of FIG. 3 generates the first and second output signals OUT1 and OUT2 that have a duty ratio of about 50:50, respectively.

Figure 8A:
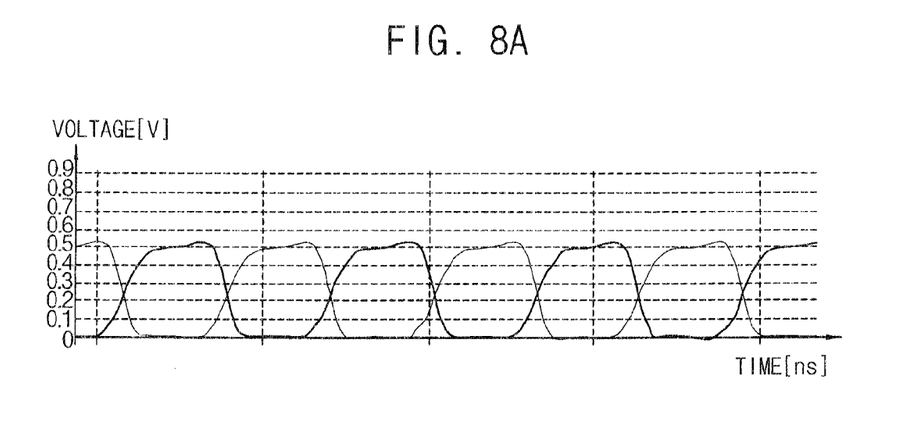
FIGS. 8A, 8B and 8C are timing diagrams for describing operations of the VCO 200 of FIG. 3.
Figure 8B:
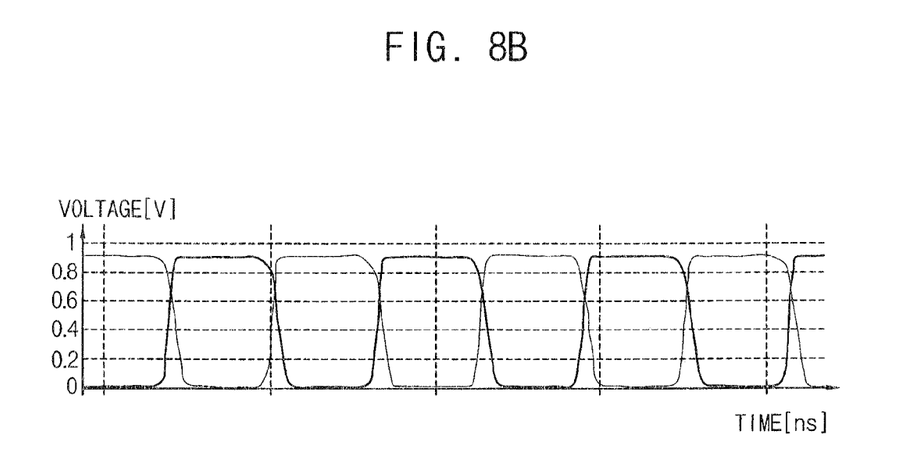
Figure 8C:
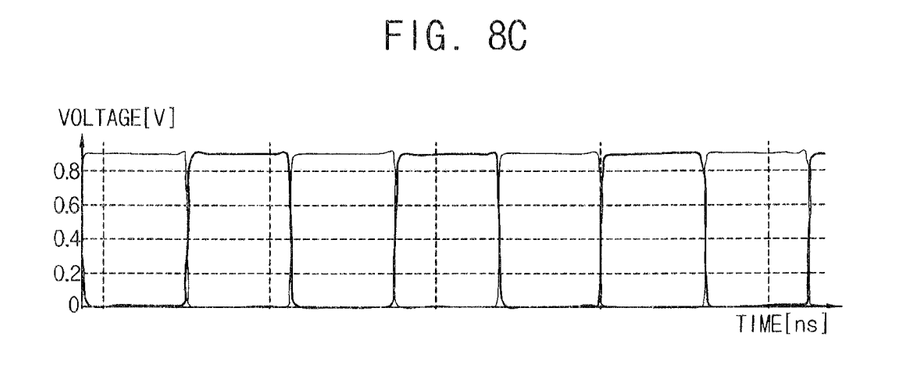

FIGS. 8A, 8B and 8C are timing diagrams for describing operations of the VCO 200 of FIG. 3. FIG. 8A represents waveforms of the first and second oscillation signals OS1 and OS2 in FIG. 3. FIG. 8B represents waveforms of the first and second swing signals SS1 and SS2 in FIG. 3. FIG. 8C represents waveforms of the first and second output signals OUT1 and OUT2 in FIG. 3.

Referring to FIG. 8A, the first oscillation signal OS1 has a sinusoidal waveform, and the duty ratio of the first oscillation signal OS1 is about 50:50. However, the first oscillation signal OS1 limitedly swings between the third voltage (e.g., about 0.5V) and the second voltage (e.g., 0V). The second oscillation signal OS2 has a waveform complementary with the first oscillation signal OS1.

Referring to FIG. 8B, the first swing signal SS1 has a square waveform, and fully swings between the first voltage (e.g., about 0.9V) and the second voltage (e.g., about 0V). However, the duty ratio of the first swing signal SS1 is not about 50:50, but is about 53:47. The second swing signal SS2 has a waveform similar to but opposite in phase to the first swing signal SS1.

Referring to FIG. 8C, the first output signal OUT1 has a square waveform, fully swings between the first voltage (e.g., about 0.9V) and the second voltage (e.g., 0V). The duty ratio of the first output signal OS1 is about 50:50, because of the phase interpolation operation. The second output signal OUT2 has a waveform complementary with the first output signal OUT1, and also has duty ratio of about 50:50.

Figure 9:
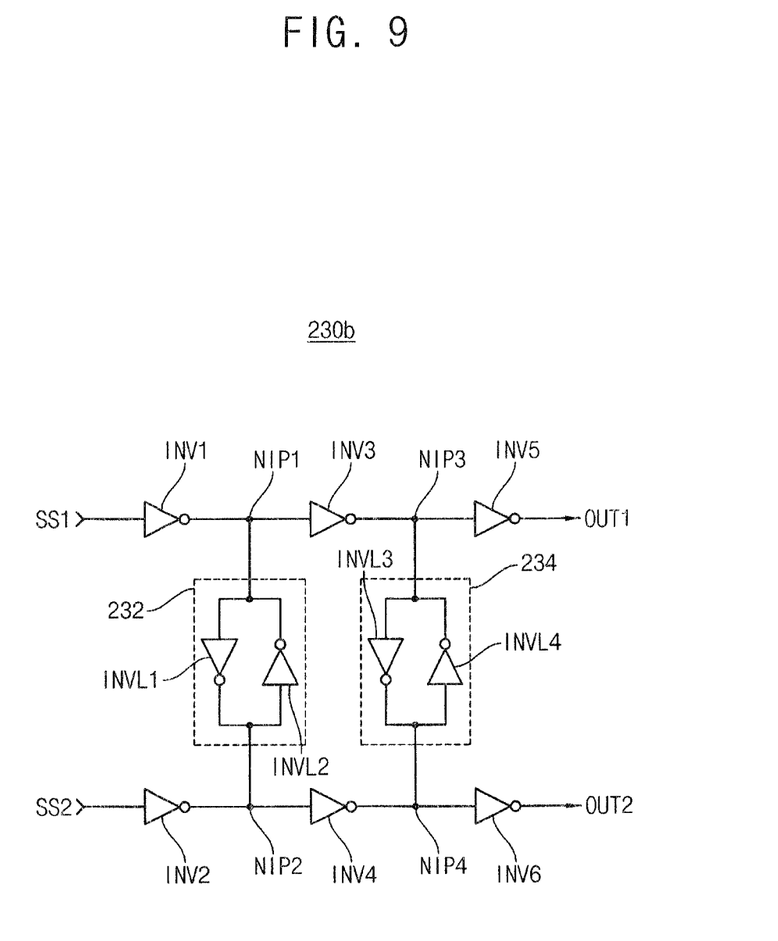
FIG. 9 is a block diagram of another exemplary implementation 230b of the interpolation circuit 230 in the VCO 200 of FIG. 3.

FIG. 9 is a block diagram of another exemplary implementation 230b of the interpolation circuit 230 included in the VCO of FIG. 3.

Referring to FIG. 9, an interpolation circuit 230b includes a first inverter INV1, a second inverter INV2, a first latch 232, a third inverter INV3, a fourth inverter INV4, a second latch 234, a fifth inverter INV5 and a sixth inverter INV6.

In comparison with the interpolation circuit 230a of FIG. 6, the interpolation circuit 230b further includes the second latch 234, the fifth inverter INV5 and the sixth inverter INV6. The first inverter INV1, the second inverter INV2, the first latch 232, the third inverter INV3 and the fourth inverter INV4 in FIG. 9 may be substantially the same as the first inverter INV1, the second inverter INV2, the first latch 232, the third inverter INV3 and the fourth inverter INV4 in FIG. 6, respectively. Thus, in FIG. 9, the same reference numerals will be used to refer the same or like elements in FIG. 6, and redundant descriptions will be omitted.

The second latch 234 is connected between the output terminal of the third inverter INV3 (i.e., a third internal node NIP3) and the output terminal of the fourth inverter INV4 (i.e., a fourth internal node NIP4), and performs the phase interpolation operation by merging an output signal of the third inverter INV3 and an output signal of the fourth inverter INV4. The second latch 234 includes a third internal inverter INVL3 and a fourth internal inverter INVL4, where inputs and outputs of the inverters INVL3 and INVL4 are cross-coupled. The input terminal of the third internal inverter INVL3 is connected to the third internal node NIP3 and its output terminal is connected to the fourth internal node NIP4. The input terminal of the fourth internal inverter INVL4 is connected to the fourth internal node NIP4 and its output terminal is connected to the third internal node NIP3.

The input terminal of the fifth inverter INV5 is connected to the third internal node NIP3. The input terminal of the sixth inverter INV6 is connected to the fourth internal node NIP4. The fifth inverter INV5 inverts a voltage at the third internal node NIP3 to provide the first output signal OUT1. The sixth inverter INV6 inverts a voltage at the fourth internal node NIP4 to provide the second output signal OUT2.

Although not illustrated in FIG. 7, the first time interval having a logic low level (i.e., VSS) is longer than a second time interval having a logic high level (i.e., VDD) in the first swing signal SS1. Thus, a logic high time interval of the first swing signal SS1 is longer than a logic low time interval of the first swing signal SS1 according to some exemplary embodiments. In this case, the first and second internal voltages VIP1 and VIP2 may not be overlapped, and thus the first latch 232 may perform the phase interpolation operation abnormally. In the interpolation circuit 230b of FIG. 9, the second latch 234 performs the phase interpolation operation even if the first latch 232 performs the phase interpolation operation abnormally. Thus, the VCO 200 of FIG. 3 including the interpolation circuit 230b of FIG. 9 may stably generate the output signals OUT1 and OUT2.

Figure 10:
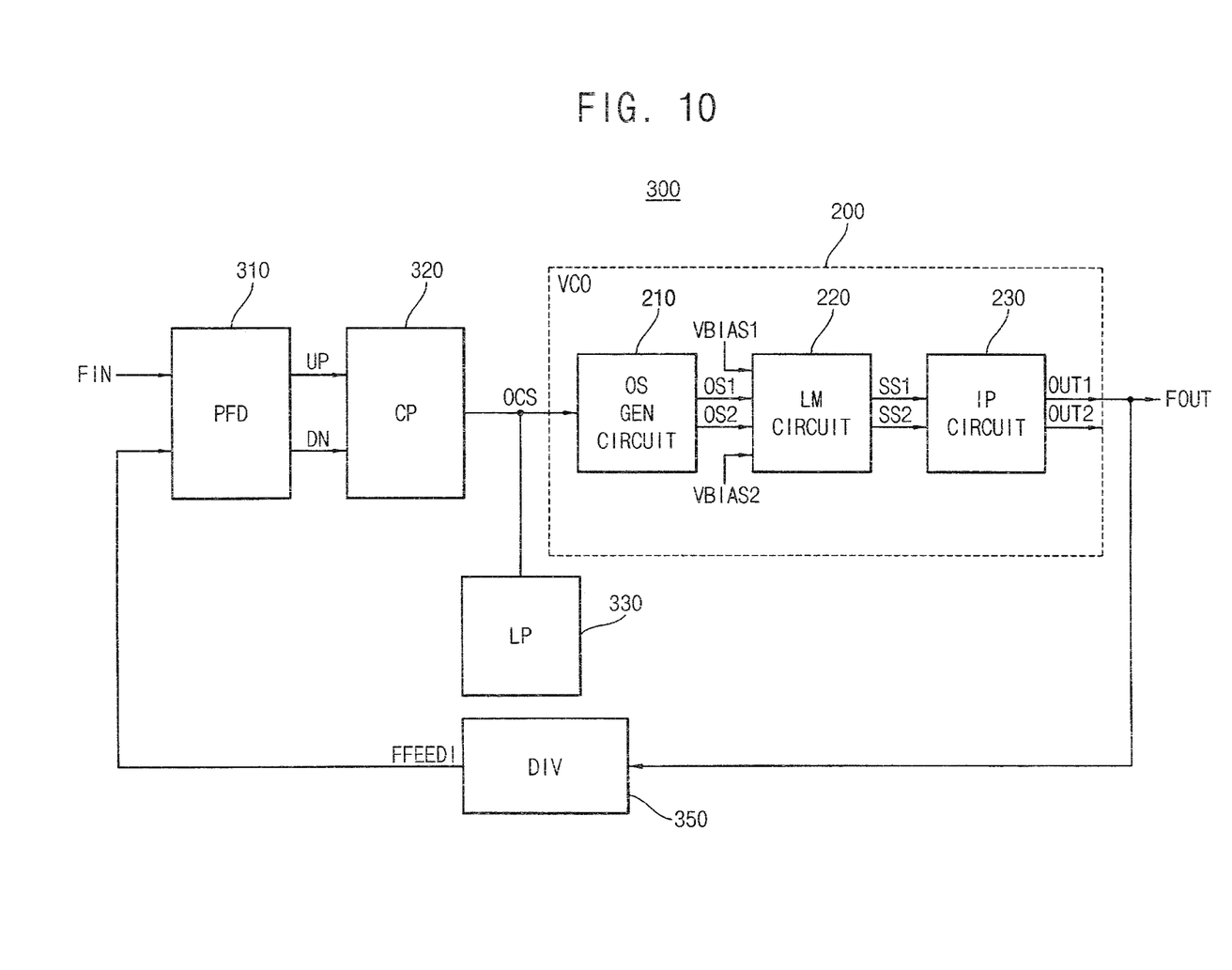
FIG. 10 is a block diagram of a phase locked loop (PLL) 300 including the VCO 200 of FIG. 3.

FIG. 10 is a block diagram of a phase locked loop (PLL) including the VCO 200 of FIG. 3.

Referring to FIG. 10, the PLL 300 includes a phase frequency detector (PFD) 310, a charge pump 320, a loop filter 330, the voltage-controlled oscillator (VCO) 200 of FIG. 3 and a frequency divider 350.

The PFD 310 generates an up signal UP and a down signal DN by detecting the phase difference between an input signal FIN and a feedback input signal FFEEDI corresponding to an output signal FOUT. For example, the up signal UP is activated when the phase of the input signal FIN leads the phase of the feedback input signal FFEEDI. Conversely, the down signal DN is activated when the phase of the feedback input signal FFEEDI leads the phase of the input signal FIN. The input signal FIN may be generated by a crystal oscillator that uses a crystal material, and may have a fixed frequency. Thus, the frequency of the input signal FIN may be used as a reference frequency for the frequency of the feedback input signal FFEEDI.

The charge pump 320 provides a predetermined current to the loop filter 330 based on the up signal UP or the down signal DN. The loop filter 330 comprises a capacitance and receives the predetermined current, generates an oscillation control signal (voltage) OCS to be supplied to the VCO 200, and maintains the oscillation control signal OCS at a fairly constant voltage level. The VCO 200 generates the oscillating output signal FOUT based on the oscillation control signal OCS. The frequency divider 350 generates the feedback input signal FFEEDI by dividing the output signal FOUT. The feedback input signal FFEEDI is provided to the PFD 310.

The PLL 300 repeatedly performs such detecting, adjusting and generating operations to compensate phase and frequency differences between the input signal FIN and the output signal, and to maintain the output signal FOUT at a fixed frequency.

The VCO 200 in FIG. 10 is the same as the VCO 200 of FIG. 3. The interpolation circuit 200 generates the first output signal OUT1 and the second output signal OUT2 by compensating the duty ratio of the first swing signal SS1 and the duty ratio of the second swing signal SS2. The duty ratio of the first output signal OUT1 is about 50:50 and the duty ratio of the second output signal OUT2 is about 50:50. The VCO 200 in the phase locked loop (PLL) 300 of FIG. 10 outputs either one of the first and second output signals OUT1 and OUT2 as the output signal FOUT.

In a double data rate (DDR) method, the data I/O speed is doubled in a way that data are respectively transferred at both a rising edge and a falling edge of one period of a clock signal, and thus the duty ratio of the clock signal is one of important factors that can be controlled for improving the performance of the semiconductor device. The DDR method is widely used in various high-speed applications and/or high-speed processors, such as an advanced RISC machine (ARM) processor. Typically, applications and/or processors include at least one PLL for generating the clock signal. A conventional PLL adjusts the duty ratio of the clock signal based on a first adjustment scheme or a second adjustment scheme. In the first adjustment scheme, the PLL generates the clock signal, and a duty cycle corrector located outside the PLL adjusts the duty ratio of the clock signal. However, the conventional PLL driven by the first adjustment scheme is sensitive to PVT variations and has relatively large size. In the second adjustment scheme, the PLL generates an internal clock signal that has a frequency being twice as high as a target frequency, and divides the internal clock signal by using a frequency divider (e.g., a master-slave flip-flop) in the PLL to generate the clock signal having the target frequency. However, the conventional PLL driven by the second adjustment scheme has relatively high power consumption.

The PLL 300 according to the present exemplary embodiment includes the VCO 200 being substantially the same as the VCO 200 of FIG. 2. Thus the PLL 300 may effectively generate the output signal FOUT having a duty ratio of about 50:50, without including an additional duty cycle corrector and/or without generating an internal clock signal that has a frequency being twice as high as the target frequency. Thus, the PLL 300 may have relatively simple structure, small size, low power consumption, and robust performance against PVT variations.

Figure 11:
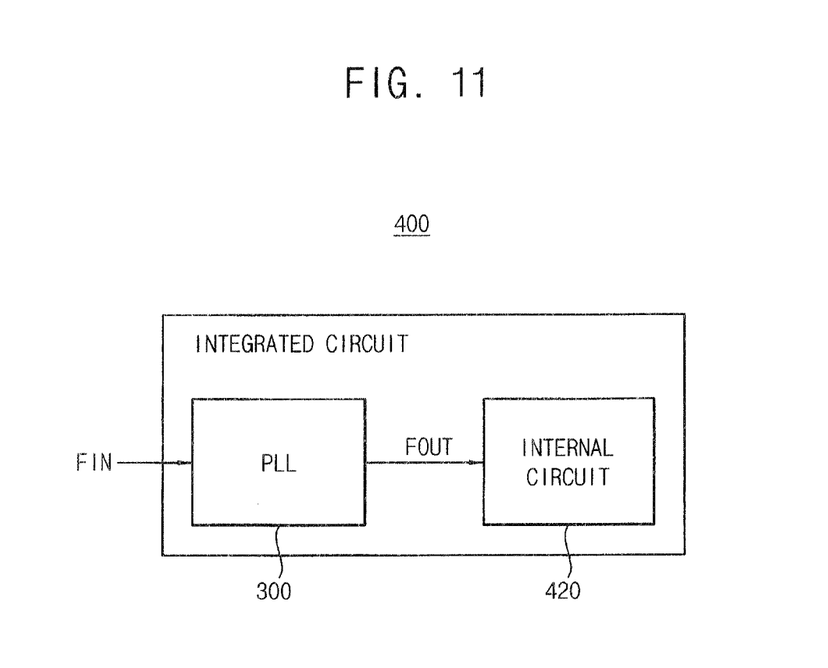
FIG. 11 is a block diagram of an integrated circuit including the PLL 300 of FIG. 10.

FIG. 11 is a block diagram illustrating an integrated circuit including the PLL 300 of FIG. 10.

Referring to FIG. 11, an integrated circuit 400 includes the PLL 300 of FIG. 10 and an internal circuit 420. In some exemplary embodiments, the integrated circuit 400 may be one of various devices and/or systems, such as an application processor (AP), a microprocessor, a central processing unit (CPU), an application-specific integrated circuit (ASIC), a mobile system on chip (SoC), a multimedia SoC, a smartcard, etc.

The PLL 300 generates an output signal FOUT based on an input signal FIN, and maintains the output signal FOUT at a fixed phase and a fixed frequency. The PLL 300 is the PLL 300 of FIG. 10. For example, the PLL 300 may effectively generate the output signal FOUT having a duty ratio of about 50:50, with relatively simple structure, small size, low power consumption, and robust performance against PVT variations. The internal circuit 420 operates based on the output signal FOUT. For example, the output signal FOUT may be used in the internal circuit as a clock signal.

Figure 12:
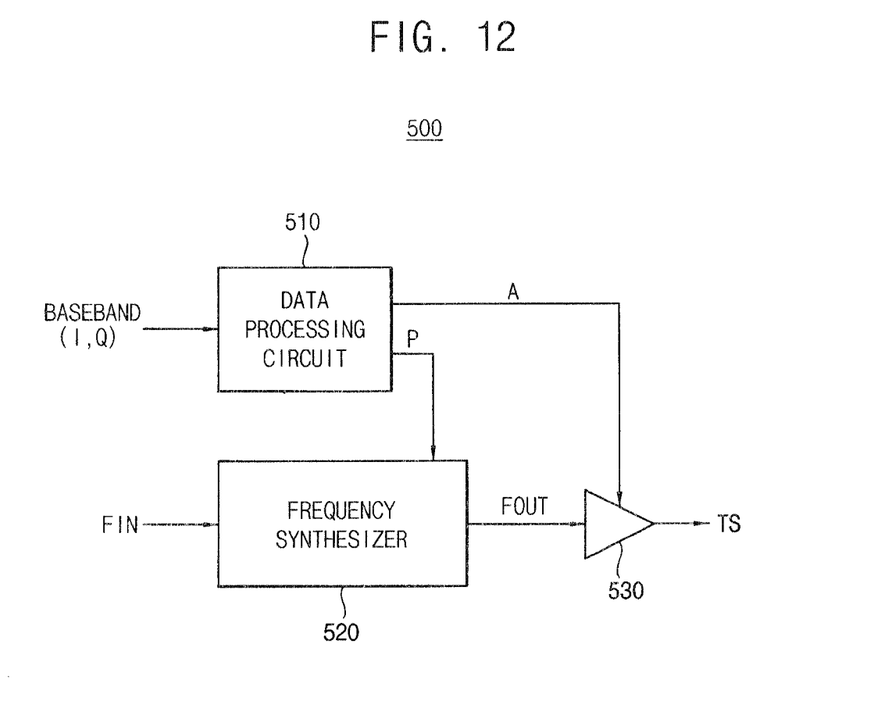
FIG. 12 is a block diagram of a transmitter including the PLL 300 of FIG. 10.

FIG. 12 is a block diagram illustrating a transmitter including the PLL 300 of FIG. 10.

Referring to FIG. 12, a transmitter 500 includes a data processing circuit 510, a frequency synthesizer 520 and a power amplifier 530.

The data processing unit 510 processes baseband data BASEBAND including an in-phase signal I and a quadrature signal Q to convert the processed baseband data BASEBAND to an amplitude signal A and a phase signal P. In an exemplary embodiment, the data processing unit 510 may be implemented with a coordinate rotational digital computer (CORDIC), and the data processing unit 510 may convert the baseband data BASEBAND represented as coordinate components on the I-signal axis and the Q-signal axis to the amplitude component (i.e., the amplitude signal A) and the phase component (i.e., the phase signal P).

The frequency synthesizer 520 generates an output signal FOUT based on an input signal FIN and the phase signal P. In an exemplary embodiment, the frequency synthesizer 520 may include an adder for adding the input signal FIN to the phase signal P, and the PLL 300 of FIG. 10 for generating the output signal based on the added signal. For example, the PLL (not shown in FIG. 12) may effectively generate the output signal FOUT having a duty ratio of about 50:50, with relatively simple structure, small size, low power consumption, and robust performance against PVT variations.

The power amplifier 530 synthesizes the output signal FOUT and the amplitude signal A to output a transmission signal TS. For example, the power amplifier 530 may receive the output signal FOUT, and may provide the transmission signal TS having output levels according to the amplitude signal A.

Figure 13:
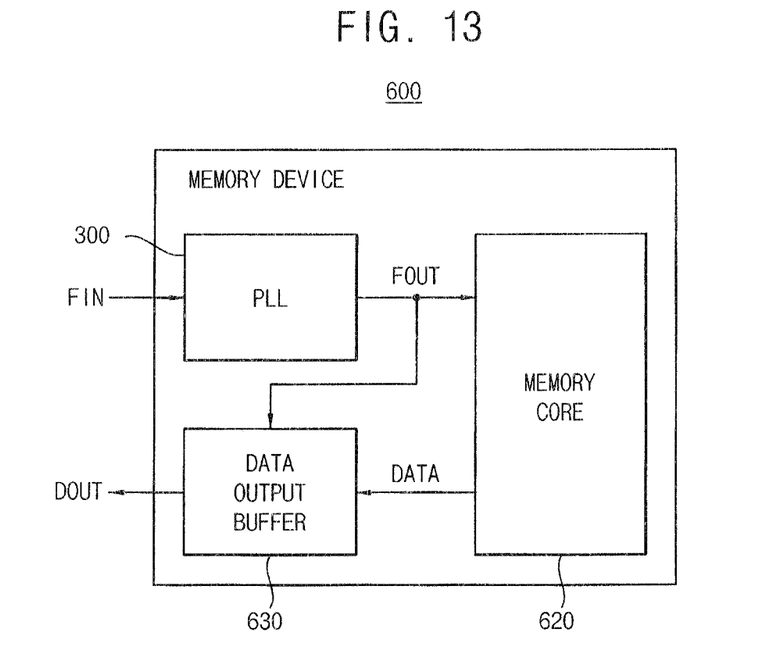
FIG. 13 is a block diagram of a memory device including the PLL 300 of FIG. 10.

FIG. 13 is a block diagram illustrating a memory device including the PLL 300 of FIG. 10.

Referring to FIG. 13, a memory device 600 includes the PLL 300 of FIG. 10, a memory core 620 and a data output buffer 630. In some exemplary embodiments, the memory device 600 may be one of various memory device types, such as a dynamic random access memory (DRAM) device, a static random access memory (SRAM) device, a DDR synchronous DRAM (SDRAM), a graphic DDR (GDDR) SDRAM, an erasable programmable read-only memory (EPROM) device, an electrically erasable programming read-only memory (EEPROM) device, a flash memory device, etc.

The PLL 300 generates an output signal FOUT based on an input signal FIN, and maintains the output signal FOUT at a fixed phase and a fixed frequency. The PLL 300 is the PLL 300 of FIG. 10. Thus, the PLL 300 may effectively generate the output signal FOUT having a duty ratio of about 50:50, with relatively simple structure, small size, low power consumption, and robust performance against PVT variations.

The memory core 620 stores input data provided from a data input buffer (not illustrated) as write data, and provides read data DATA to the data output buffer 2300 based on the stored write data. The memory core 620 performs such writing and reading operations based on the output signal FOUT. In an exemplary embodiment, the memory core 620 may include a memory cell array (not illustrated) having a plurality of memory cells that store data, a row decoder (not illustrated) for selecting a word line of the memory cell array by decoding a row address, a column decoder (not illustrated) for selecting at least one bit line of the memory cell array 2210 by decoding a column address, and a sense amplifier (not illustrated) for generating the read data DATA by sensing the data stored in selected memory cells.

The data output buffer 630 transfers the read data DATA as output data DOUT to a data input/output (I/O) pin (not illustrated) based on the output signal FOUT. For example, the output data DOUT may be in synchronization with the output signal FOUT, and may be provided to an external device, such as a memory controller.

Figure 14:
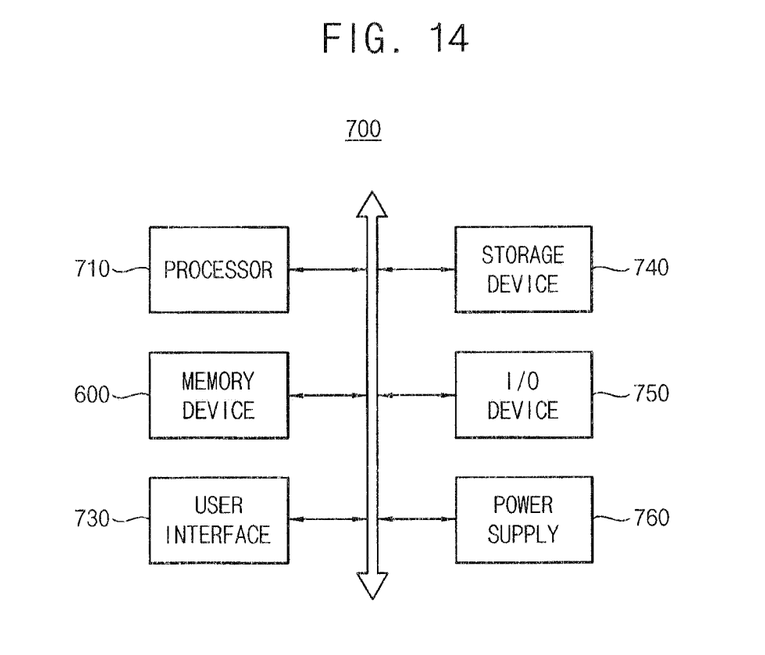
FIG. 14 is a block diagram of an electronic system including the PLL 300 of FIG. 10.

FIG. 14 is a block diagram illustrating an electronic system including the PLL 300 of FIG. 10.

Referring to FIG. 14, the electronic system 700 includes a processor 710, a memory device 720, an user interface 730, a storage device 740, an I/O device 750 and a power supply 760. Although not illustrated in FIG. 14, the electronic system 700 may further include a plurality of ports for communicating a video card, a sound card, a memory card, a universal serial bus (USB) device, other electric devices, etc. The electronic system 700 may further include a baseband chipset, an application chipset, an image sensor, etc.

The processor 710 performs various computing functions. The processor 710 may be a microprocessor, a CPU, etc. The processor 710 may be connected to the memory device 720, the user interface 730, the storage device 740, and the I/O device 750 via a bus such as an address bus, a control bus, a data bus, etc. The processor 710 may be connected to an extended bus such as a peripheral component interconnection (PCI) bus.

In an exemplary embodiment, the processor 710 may be implemented with a single-core processor or a multi-core processor, such as a dual-core processor, a quad-core processor, a hexa-core processor, etc. For example, assuming that the processor 710 is an ARM processor, the processor 710 may be implemented with the single-core processor when the processor 710 operates with relatively low speed (e.g., lower than about 1 GHz), and may be implemented with the multi-core processor when the processor 710 operates with relatively high speed (e.g., higher than about 1 GHz). For example, the multi-core ARM processor may be connected to the peripheral devices (e.g., the memory device 720, the user interface 730, the storage device 740, and the I/O device 750) via an advanced extensible interface (AXI) bus.

The memory device 720 stores data for operations of the electronic system 700. The memory device 600 is the memory device 600 of FIG. 13. For example, the memory device 600 may include a PLL 300 of FIG. 10 that generates an output signal based on an input signal, and maintains the output signal at a fixed phase and a fixed frequency. The PLL 300 may effectively generate the output signal having a duty ratio of about 50:50, with relatively simple structure, small size, low power consumption, and robust performance against PVT variations.

The user interface 730 includes various means for interconnecting an user and the electronic system 700. The storage device 740 includes a solid state drive device, a hard disk drive device, a CD-ROM device, etc. The I/O device 750 includes input devices such as a keyboard, a keypad, a mouse, etc, and output devices such as a printer, a display device, etc. The power supply 760 provides a power for operations of the electronic system 700.

The above described embodiments may be applied to various circuits and/or devices for requiring a stable oscillating signal (e.g., a clock signal), and an electronic system having the circuits and/or devices. Thus, the present inventive concept may be applied to a system, such as a desktop computer, a laptop computer, a digital camera, a video camcorder, a cellular phone, a smart phone, a portable multimedia player (PMP), a personal digital assistant (PDA), an MP3 player, a digital television, a solid state drive (SSD), a navigation device, an application processor (AP), a microprocessor, a central processing unit (CPU), an application-specific integrated circuit (ASIC), a mobile system on chip (SoC), a multimedia SoC, a smartcard, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A limiter circuit in a voltage controlled oscillator (VCO) comprising:
    a first control circuit configured to generate a first driving control signal based on an input signal and a first bias voltage;
    a second control circuit configured to generate a second driving control signal based on the input signal and a second bias voltage; and
    a driving circuit configured to generate an output signal based on the first driving control signal and the second driving control signal, wherein the output signal swings between a first voltage and a second voltage;
    wherein the first control circuit generates a first alternating current (AC) signal by removing the direct current (DC) component of the input signal, and generates the first driving control signal by adding the first AC signal to the first bias voltage.

2. The limiter circuit of claim 1, wherein the second control circuit generates a second AC signal by removing the DC component of the input signal, and generates the second driving control signal by adding the second AC signal to the second bias voltage.

3. A limiter circuit in a voltage controlled oscillator (VCO) comprising:
    a first control circuit configured to generate a first driving control signal based on an input signal and a first bias voltage;
    a second control circuit configured to generate a second driving control signal based on the input signal and a second bias voltage; and
    a driving circuit configured to generate an output signal based on the first driving control signal and the second driving control signal, wherein the output signal swings between a first voltage and a second voltage;
    wherein the first control circuit includes:
        a first capacitor receiving the input signal at its first electrode and having its second electrode connected to a first node, the first driving control signal being output at the first node; and
        a first resistor having a first end receiving the first bias voltage and a second end connected to the first node.

4. The limiter circuit of claim 3, wherein the second control circuit includes:
    a second capacitor receiving the input signal at its first electrode and having its second electrode connected to a second node, the second driving control signal being output at the second node; and
    a second resistor having a first end receiving the second bias voltage and a second end connected to the second node.

5. A limiter circuit in a voltage controlled oscillator (VCO) comprising:
    a first control circuit configured to generate a first driving control signal based on an input signal and a first bias voltage;
    a second control circuit configured to generate a second driving control signal based on input signal and a second bias voltage; and
    a driving circuit configured to generate an output signal based on the first driving control signal and the second driving control signal, wherein the output signal swings between a first voltage and a second voltage;
    wherein both of the level of the first bias voltage and the level of the second bias voltage are lower than the level of the first voltage.

6. The limiter circuit of claim 5, wherein the driving circuit includes a pull-up transistor and a pull-down transistor connected in series between the first voltage and the second voltage, wherein the control gate of the pull-up transistor receives the first driving control signal, and the control gate of the pull-down transistor receives the second driving control signal.

7. The limiter circuit of claim 6, wherein the level of the first voltage is higher than the threshold voltage level of the pull-up transistor and higher than the threshold voltage level of the pull-down transistor.

8. A voltage controlled oscillator (VCO) comprising:
    an oscillation signal generation circuit configured to generate a first oscillation signal and a second oscillation signal based on an oscillation control signal, the first and second oscillation signals being a pair of differential signals;
    a limiter circuit configured to generate a first swing signal based on the first oscillation signal, a first bias voltage and a second bias voltage, and configured to generate a second swing signal based on the second oscillation signal, the first bias voltage and the second bias voltage, the first swing signal swinging between a first voltage and a second voltage, the second swing signal swinging between the first voltage and the second voltage.

9. The VCO of claim 8, further comprising an interpolation circuit configured to generate a first output signal and a second output signal by compensating the duty ratio of the first swing signal and the duty ratio of the second swing signal, the first and second output signals being a pair of differential signals.

10. The VCO of claim 9, wherein both of the duty ratio of the first output signal and the duty ratio of the second output signal are about 50:50.

11. The VCO of claim 8, wherein the oscillation signal generation circuit includes:
   an oscillation control circuit configured to generate a control current based on the oscillation control signal; and
   an oscillation circuit configured to generate the first oscillation signal and the second oscillation signal based on the control current, the frequency of the first oscillation signal and the frequency of the second oscillation signal corresponding to the oscillation control signal.

12. The VCO of claim 11, wherein a third voltage is induced based on the control current, and the first and second oscillation signals swing between the third voltage and the second voltage, the level of the third voltage being lower than the level of the first voltage and being higher than the level of the second voltage.

13. The VCO of claim 8, wherein the limiter circuit includes:
   a first limiter circuit configured to generate a first driving control signal and a second driving control signal based on the first oscillation signal, the first bias voltage and the second bias voltage, and configured to generate the first swing signal based on the first driving control signal and the second driving control signal; and
   a second limiter circuit configured to generate a third driving control signal and a fourth driving control signal based on the second oscillation signal, the first bias voltage and the second bias voltage, and configured to generate the second swing signal based on the third driving control signal and the fourth driving control signal.

14. The VCO of claim 9, wherein the interpolation circuit generates the first output signal and the second output signal by performing a phase interpolation operation on the first swing signal and the second swing signal.

15. The VCO of claim 14, wherein the interpolation circuit includes:
   a first inverter receiving the first swing signal;
   a second inverter receiving the second swing signal;
   a latch connected between the output terminal of the first inverter and the output terminal of the second inverter, the latch performing the phase interpolation operation by merging the output signal of the first inverter and the output signal of the second inverter;
   a third inverter having its input terminal connected to the output terminal of the first inverter and its output terminal outputting the first output signal; and
   a fourth inverter having its input terminal connected to the output terminal of the second inverter and its output terminal outputting the second output signal.

16. An apparatus comprising a semiconductor device having a phase locked loop (PLL) including the voltage controlled oscillator (VCO) of claim 8.

17. The apparatus of claim 16, wherein the semiconductor device includes a memory device including the PLL.

18. The apparatus of claim 16, wherein the apparatus is a desktop computer, a laptop computer, a digital camera, a video camcorder, a cellular phone, a smart phone, a portable multimedia player (PMP), a personal digital assistant (PDA), an MP3 player, a digital television, a solid state drive (SSD), a navigation device, an application processor (AP), a microprocessor, a central processing unit (CPU), an application-specific integrated circuit (ASIC), a mobile system on chip (SoC), a multimedia SoC, or a smartcard.

\* \* \* \* \*